United States Patent
Zhang et al.

(10) Patent No.: US 9,559,699 B1
(45) Date of Patent: Jan. 31, 2017

(54) CMOS GLOBAL INTERCONNECT USING MULTI-VOLTAGE(OR CURRENT)-LEVELS

(71) Applicant: ALTERA CORPORATION, San Jose, CA (US)

(72) Inventors: Weimin Zhang, San Jose, CA (US); Yanzhong Xu, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/004,683

(22) Filed: Jan. 22, 2016

(51) Int. Cl.
| | |
|---|---|
| H03K 19/177 | (2006.01) |
| H03K 17/687 | (2006.01) |
| H03M 1/66 | (2006.01) |
| H03K 5/159 | (2006.01) |

(52) U.S. Cl.
CPC .......... *H03K 19/1774* (2013.01); *H03K 5/159* (2013.01); *H03K 17/6872* (2013.01); *H03M 1/661* (2013.01)

(58) Field of Classification Search
CPC .................... H03K 19/17774; H03K 17/6872; H03K 5/159
USPC ................................ 326/38, 82, 83
See application file for complete search history.

(56) References Cited

U.S. PATENT DOCUMENTS

| | | | |
|---|---|---|---|
| 5,504,444 A | 4/1996 | Neugebauer | |
| 5,596,297 A | 1/1997 | McClure et al. | |
| 5,793,247 A * | 8/1998 | McClure | G05F 3/262 327/530 |
| 6,452,418 B1 * | 9/2002 | Singh | H03K 19/00361 326/68 |
| 2009/0243701 A1 * | 10/2009 | Thompson | H03K 17/16 327/419 |
| 2011/0261138 A1 * | 10/2011 | Nagumo | G03G 15/326 347/247 |
| 2014/0266322 A1 * | 9/2014 | Wang | H03K 17/163 327/108 |

OTHER PUBLICATIONS

Fei Li, et al., "Vdd Programmability to Reduce FPGA Interconnect Power," Proceedings of the International Conference on Computer Aided Design, pp. 1-6, 2004.
Ron Ho, "Efficient On-Chip Global Interconnects," 2003 Symposium on VLSI Circuits Digest of Technical Papers, pp. 1-4.

* cited by examiner

*Primary Examiner* — Don Le
(74) *Attorney, Agent, or Firm* — Steven J. Cahill

(57) ABSTRACT

A method and apparatus for reducing global interconnect delay on a field programmable gate array (FPGA) on an integrated circuit die comprising coding with a digital to analog coder on the integrated circuit die successive groups of n digital bits into an $2^n$ level voltage or current signal where n is an integer greater than or equal to 2; transmitting the voltage or current signal on a global interconnect on the integrated circuit die; receiving on the integrated circuit die the signal transmitted on the global interconnect; and decoding the received signal on the integrated circuit die to reconstitute the successive groups of digital bits.

20 Claims, 5 Drawing Sheets

CMOS GLOBAL INTERCONNECT USING MULTI-VOLTAGE(OR CURRENT)-LEVELS

BACKGROUND

Global interconnect delay has become a significant bottleneck in high speed circuits as technology scales. Power loss is also a significant issue.

FIG. 1 depicts a generalized layout for a field programmable gate array (FPGA) 100 on a single integrated circuit die 110. As indicated, the die 110 is approximately square and measures about 30 millimeters (mm.) (1.2 inches) on a side. Several logic array blocks 120 are located on the die. These blocks are interconnected by various signal paths 130 including high speed global routing networks.

In the early years of FPGAs, the signaling on the global networks was two-level (high and low) single-ended. To increase speed and accuracy, low voltage differential signaling was introduced to the global routing network. However, interconnect remains a problem that introduces substantial bottlenecks in routing.

Signaling also consumes substantial amounts of power, thereby imposing on the integrated circuit die both significant power requirements and significant issues in disposing of the heat generated by the signaling. The power lost by signaling is given by: $P = \Sigma(Pr(\Delta \text{ swing})) \times \Delta \text{ swing} \times Cout \times Vdd \times fclk$;

where $\Delta$ swing is the difference at the driver output between the successive voltage levels;

Pr ($\Delta$ swing) is the probability of switching from one voltage level to another, which in the case of conventional two-level signaling is ½;

Cout is the driver output capacitive load;

Vdd is the supply voltage; and fclk is the clock frequency.

SUMMARY

We reduce this problem by using multi-level signaling on the global interconnects which requires four or more levels. In an illustrative embodiment, our invention is a method for reducing global interconnect delay on a field programmable gate array (FPGA) on an integrated circuit die comprising coding with a digital to analog coder on the integrated circuit die successive groups of n digital bits into an $2^n$ level voltage or current signal where n is an integer greater than or equal to 2; transmitting the voltage or current signal on a global interconnect on the integrated circuit die; receiving on the integrated circuit die the signal transmitted on the global interconnect; and decoding the received signal on the integrated circuit die to reconstitute the successive groups of digital bits.

In other aspects, the digital to analog coder comprises one or more driver circuits that produce digital to analog coding of successive groups of n digital bits into $2^n$ level voltage or current signals. An illustrative embodiment of our invention is a low power driver circuit comprising a first current mirror coupled to a high voltage rail, the first current mirror producing at a first output terminal a first output voltage that is controllable by a first bias voltage; a second current mirror coupled to a low voltage rail, the second current mirror producing at a second output terminal a second output voltage that is controllable by a second bias voltage; at least a first diode coupled between the first output terminal of the first current mirror and the low voltage rail, whereby the first current mirror supplies a regulated voltage to the first diode; and at least a first transistor having first, second and third terminals, the first and second terminals being coupled between the high voltage rail and the second output terminal of the second current mirror, the third terminal being a gate terminal that is coupled to the first diode and the first output terminal of the first current mirror, whereby an output voltage is available from an output terminal of the driver circuit that is connected to the second output terminal of the second current mirror that is less than the voltage on the high voltage rail. For this embodiment, the output voltage is approximately 0.33 V (Volt).

In another illustrative embodiment, the second current mirror of the low power driver circuit described above includes a plurality of output terminals controllable by the second bias voltage; and the circuit further comprises at least two diodes coupled between the output terminal of the first current mirror and the low voltage rail and a second transistor having first, second and third terminals. The first and second terminals are coupled between the high voltage rail and a second one of the output terminals of the second current mirror. The third terminal is a gate terminal that is coupled to the first output terminal of the first current mirror. The gate terminal of the first transistor is coupled to the second terminal of the second transistor. For this embodiment, the output voltage on the output terminal is approximately 0.66 V.

In still another illustrative embodiment, the low power driver circuit described in the immediately preceding paragraph further comprises a third transistor and a second output terminal. The third transistor has first, second and third terminals, the first terminal of the third transistor being coupled to the second terminal of the second transistor; and the second terminal of the third transistor being coupled to one of the output terminals of the second current mirror and to the second output terminal. The third terminal of the third transistor is a gate terminal that is coupled to a node between two of the diodes. For this embodiment, the voltage on the first output terminal is approximately 0.66 V and the voltage on the second output terminal is approximately 0.33 V.

In contemporaneous low voltage driver circuits, the voltage on the high voltage rail is typically about 1 V; and the voltage on the low voltage rail is approximately 0 V. Since the driver circuits described above provide two additional voltages levels between 0 and 1 V, use of these driver circuits in global interconnects provide for four-level signaling.

If four level signaling is used instead of conventional two-level signaling, the switching power required per bit transmitted is only 42 percent (%) of that required in two-level signaling. And if eight-level signaling is used instead of conventional two-level signaling, the switching power required per bit transmitted is only 25 percent (%) of that required in two-level signaling.

BRIEF DESCRIPTION OF DRAWING

These and other objects, features and advantages of the invention will be more readily apparent from the following Detailed Description in which.

DETAILED DESCRIPTION

Figure 1:
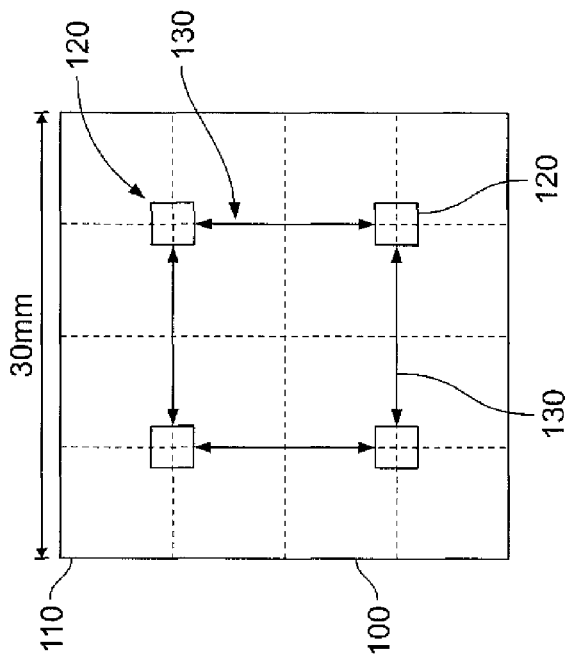
FIG. 1 is a layout of a conventional FPGA integrated circuit die.
Figure 2:
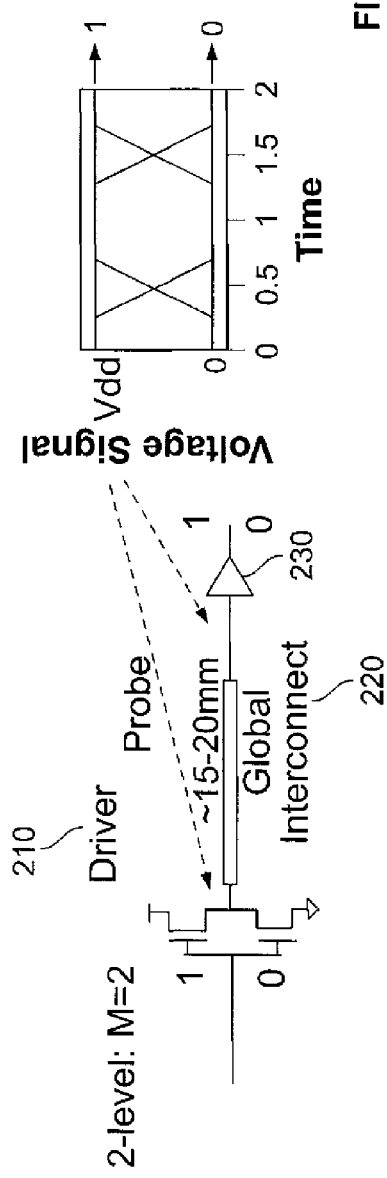
FIG. 2 is a schematic useful in understanding signaling on a conventional global routing network.

FIG. 2 is a schematic depicting conventional signaling in a global interconnection network. The network typically includes a driver 210, a global interconnect 220 and a detector 230. The driver typically is an inverter that established a high or low signal on the interconnect depending on whether it has received a 1 bit or a 0 bit. The global interconnect is a signal pathway typically 15 to 20 mm. in length on a die that is 30 mm. on a side. The detector converts received signals into digital bits and provides the bits to other circuitry on the die such as logic array blocks (not shown).

Figure 3:
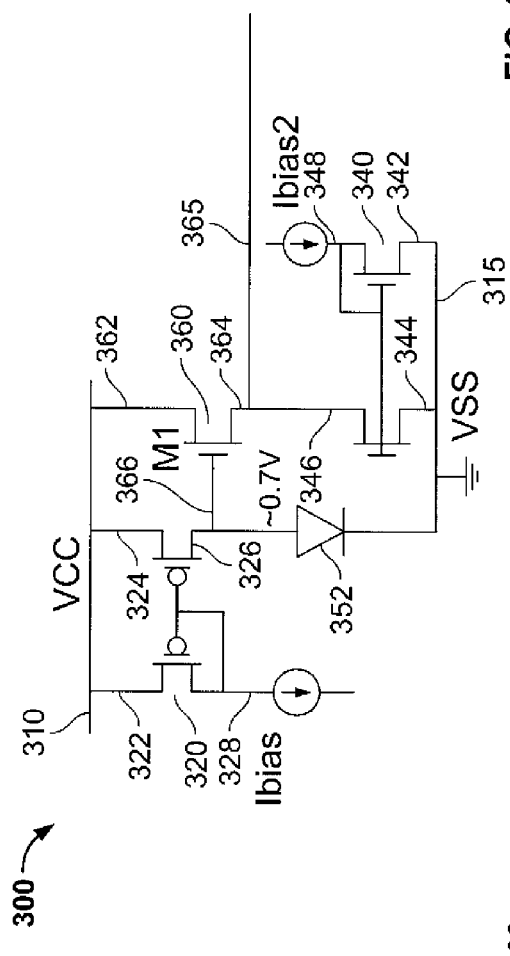
FIG. 3 is a schematic of a first illustrative embodiment of a driver circuit of the invention.

FIG. 3 is a first illustrative embodiment of the invention comprising a driver circuit 300 for generating a voltage level useful in the practice of the invention. Circuit 300 comprises a first current mirror 320 coupled to a high voltage rail 310 by terminals 322, 324, the first current mirror producing at a first output terminal 326 a first output voltage that is controllable by a first bias current applied to the current mirror at a control terminal 328. Circuit 300 further comprises a second current mirror 340 coupled to a low voltage rail 315 by terminals 342, 344, the second current mirror producing at a second output terminal 346 a second output voltage that is controllable by a second bias current applied to the second current mirror at a control terminal 348. Circuit 300 further comprises a first diode 352 coupled between the first output terminal 326 of the first current mirror and the low voltage rail 315, whereby the first current mirror supplies a regulated voltage to the first diode; and a first transistor 360 having first, second and third terminals 362, 364, 366, the first and second terminals being coupled between the high voltage rail 310 and the output terminal 346 of the second current mirror 340, the third terminal 366 being a gate terminal that is coupled to the first diode 352 and the first output terminal 326 of the first current mirror 320. An output voltage is available from the driver circuit 300 on an output terminal 365 that is coupled to the second terminal 364 of transistor 360 that is less than the voltage on the high voltage rail 310.

More particularly, for circuit 300 the output voltage Vout is approximately the difference between the voltage drop across diode 352 and the threshold voltage, Vth, of transistor 360. Illustratively, the voltage drop across diode 352 is controlled by the bias voltage applied to control terminal 328 of first current mirror 320 so that the voltage drop is relatively stable at 0.7 V. The threshold voltage of transistor 360 is approximately 0.37V. Thus, Vout~0.7 V–Vth~0.33 V. Vout is also approximately equal to Vbe–Vgs of transistor 360. Since both Vbe and Vgs have negative temperature coefficients, changes in one value due to temperature tend to be offset by changes in the other value due to temperature. The bias voltage applied to control terminal 348 of second current mirror 340 can be adjusted to stabilize Vout within operating temperature ranges.

Figure 4:
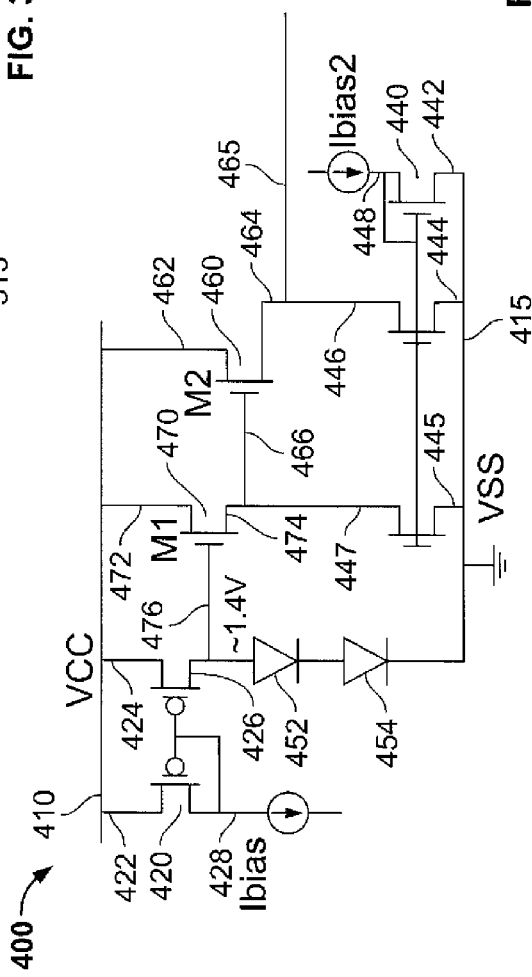
FIG. 4 is a schematic of a second illustrative embodiment of a driver circuit of the invention.

FIG. 4 is a second illustrative embodiment of the invention comprising a driver circuit 400 for generating a voltage level useful in the practice of the invention. Circuit 400 comprises a first current mirror 420 coupled to a high voltage rail 410 by terminals 422, 424, the first current mirror producing at a first output terminal 426 a first output voltage that is controllable by a first bias current applied to the current mirror at a control terminal 428. Circuit 400 further comprises a second current mirror 440 coupled to a low voltage rail 415 by terminals 442, 444, the second current mirror producing at second and third output terminals 446, 447 second and third output voltages that are controllable by a second bias current applied to the second current mirror at a control terminal 448. Circuit 400 further comprises first and second diodes 452, 454 coupled in series between the first output terminal 426 of the first current mirror 420 and the low voltage rail 415, whereby the first current mirror supplies a regulated voltage to the first diode; a first transistor 460 having first, second and third terminals 462, 464, 466, the first and second terminals being coupled between the high voltage rail 410 and the first output terminal 446 of the second current mirror 440, the third terminal 466 being a gate terminal that is coupled to the first diode 452 and the first output terminal 426 of the first current mirror 420; and a second transistor 470 having first, second and third terminals 472, 474, 476, the first and second terminals being coupled between the high voltage rail 410 and the second output terminal 447 of the second current mirror 440, the third terminal 476 being a gate terminal that is coupled to terminal 464 of the first transistor and the first output terminal 426 of the first current mirror 420. An output voltage is available from the driver circuit 400 at an output terminal 465 that is coupled to the second terminal 464 of transistor 460 that is less than the voltage on the high voltage rail 410.

More particularly, for circuit 400 the output voltage Vout is approximately the difference between the voltage drop across diodes 452 and 454 and the threshold voltages Vth of transistors 460 and 470. Illustratively, the voltage drop across diodes 452 and 454 is controlled by the bias voltage applied to control terminal 428 of first current mirror 420 so that the voltage drop is relatively stable at 1.4 V. The threshold voltages of transistors 460 and 470 are approximately 0.37 V each; and Vout~1.4 V–Vth~0.66 V. Vout is also approximately equal to Vbe–Vgs of transistors 460 and 470. Since both Vbe and Vgs have negative temperature coefficients, changes in one value due to temperature tend to be offset by changes in the other value due to temperature. The bias voltage applied to control terminal 448 of second current mirror 440 can be adjusted to stabilize Vout within operating temperature ranges.

Figure 5:
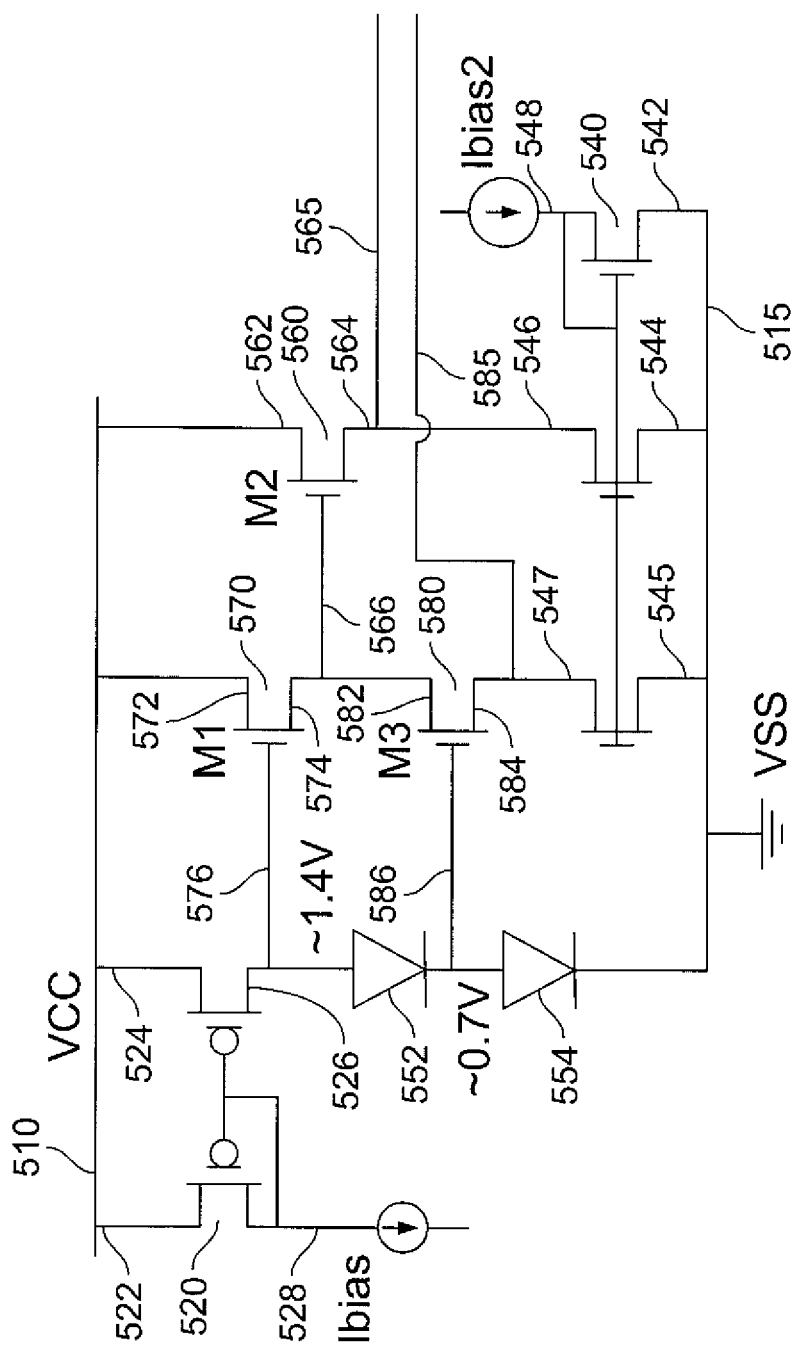
FIG. 5 is a schematic of a third illustrative embodiment of a circuit of the invention.

FIG. 5 is a third illustrative embodiment of the invention comprising a circuit 500 for generating multiple voltage levels useful in the practice of the invention. Circuit 500 comprises a first current mirror 520 coupled to a high voltage rail 510 by terminals 522, 524. the first current mirror producing at a first output terminal 526 a first output voltage that is controllable by a first bias current applied to the current mirror at a control terminal 528. Circuit 500 further comprises a second current mirror 540 coupled to a low voltage rail 515 by terminals 542, 544, the second current mirror producing at second and third output terminals 546, 547 second and third output voltages that are controllable by a second bias current applied to the second current mirror at a control terminal 548. Circuit 500 further comprises first and second diodes 552, 554 coupled in series between the first output terminal 526 of the first current mirror 520 and the low voltage rail 515, whereby the first current mirror supplies a regulated voltage to the diode. Circuit 500 further comprises a first transistor 560 having first, second and third terminals 562, 564, 466, the first and second terminals being coupled between the high voltage rail 510 and the first output terminal 546 of the second current mirror 540, the third terminal 566 being a gate terminal that is coupled to the first diode 552 and the first output terminal 426 of the first current mirror 520; a second transistor 570 having first, second and third terminals 572, 574, 576, the first and second terminals being coupled between the high voltage rail 510 and the second output terminal 574 of the second current mirror 540, the third terminal 576 being a gate terminal that is coupled to the first output terminal 526 of the first current mirror 520; and a third transistor 580 having first, second and third terminals 582, 584, 586, the first and second terminals being coupled between the second terminal 574 of the second transistor and the second output terminal 547 of the second current mirror 540, the third terminal 586 being a gate terminal that is coupled to a node between the first and second diodes 552 and 554. As a result of this arrangement, a first output voltage is available at a first output terminal 565 coupled to output terminal 564 of first transistor 560 and a second and different output voltage is available at a second output terminal 585 coupled to second terminal 584 of third transistor 580 and both output voltages are less than the voltage on the high voltage rail 510.

More particularly, the same analysis used to determine the output voltages of driver circuits 300 and 400 can be used to determine that the output voltage on the first output terminal is approximately 0.66 V and that the output voltage on the second output terminal is approximately 0.33 V.

Figure 6:
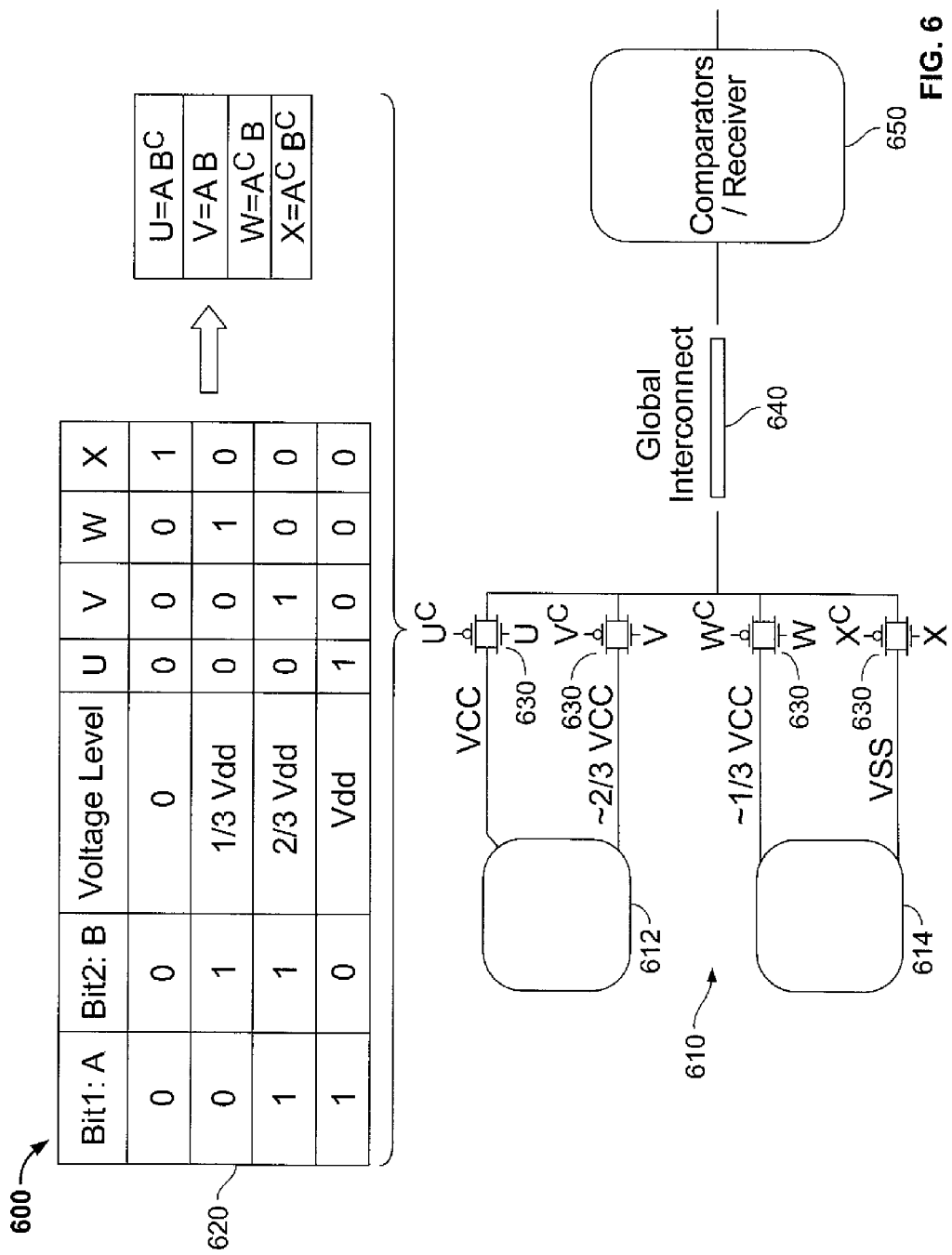
FIG. 6 is schematic depicting the use of the circuits of FIGS. 3-5 in an illustrative embodiment of the invention.

FIG. 6 is a schematic diagram depicting the use of the circuits of FIGS. 3, 4 and 5 in signaling on a global interconnect. FIG. 6 depicts a plurality of driver circuits 610: a coder 620 that generates code signals U, V, W, and X in response to input bits A and B; a plurality of pass gates 630 controlled by code signals U, V, W, and X; a global interconnect 640; and a receiver/decoder 650. Driver circuits include at least two driver circuits 612 and 614. Circuit 612 may be similar to circuit 400 and provide an output voltage VCC of approximately 1V on its high voltage rail and an output voltage of approximately 0.66 V on its output terminal. Circuit 614 may be similar to circuit 300 and provide an output voltage VSS of approximately 0 V on its low voltage rail and an output voltage of approximately 0.33 V on its output terminal. Other arrangements may be made to supply the voltages VCC and VSS. In addition, circuit 500 may be substituted for circuit 300, or circuit 400, or both.

The outputs of driver circuits 610 are controlled by pass gates 630 in accordance with the truth table set forth in FIG. 6 so as to produce on global interconnect 640 one of four voltage levels depending on the pair of bits A, B provided as inputs to coder 620. Global interconnect 640 is conventional but carries four-level signals, or more, instead of conventional two-level signals. Receiver decoder 650 detects the transmitted signals, converts them to a succession of digital bits, and forwards them to other circuitry on the semiconductor die.

Figure 7:
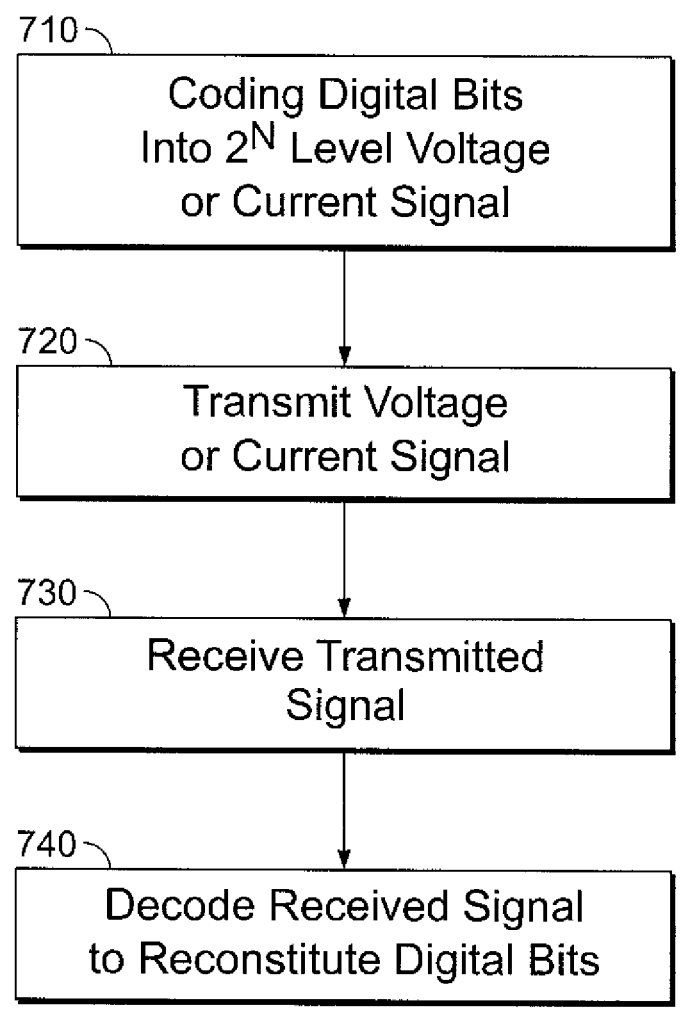
FIG. 7 is a flowchart depicting an illustrative method of practicing the invention.

FIG. 7 is a flowchart summarizing the operation of the global interconnect to reduce global interconnect delay on a field programmable gate array (FPGA) on an integrated circuit die. The method begins at step 710 by coding with a digital to analog coder on the integrated circuit die successive groups of n digital bits into a $2^n$ level voltage or current signal where n is an integer greater than or equal to 2. At step 720, the $2^n$ level signal is transmitted as a voltage or current signal on a global interconnect on the integrated circuit die. At step 730 the signal transmitted on the global interconnect is received at a decoder on the integrated circuit die. And at step 740, the received signal is decoded on the integrated circuit die to reconstitute the successive groups of digital bits.

Typically, in contemporaneous low voltage driver circuits, the voltage on the high voltage rail is about 1 V; the voltage on the low voltage rail is approximately 0 V. In such circumstances, the driver circuits described above provide two additional voltages levels between 0 and 1 V, preferably at about 0.33 V and 0.66 V. Where the voltage difference between the high and low voltage rails is different from 1 V, the circuits of FIGS. 3-5 may be modified to produce output voltages that are approximately ⅓ and ⅔ of the voltage difference between the high and low voltage rails.

While the invention has been described using driver circuits for four-level voltage signaling, its extension to driver circuits for eight-level and even higher levels will be apparent to those skilled in the art from the present description. Likewise the extension of the invention will be apparent to circuits that use four-level, eight-level, and higher current level signaling.

Numerous other embodiments of applicant's invention will be apparent to those skilled in the art from the forgoing description. For example, in circuit 500, other ways may be found to generate two output signals having voltage levels of 0.33 V and 0.66 V.

What is claimed is:

1. A low power driver circuit comprising:
   a first current mirror coupled to a high voltage rail, the first current mirror having a first output terminal;
   a second current mirror coupled to a low voltage rail, the second current mirror having a second output terminal;
   a first diode coupled between the first output terminal of the first current mirror and the low voltage rail, wherein the first current mirror supplies a regulated voltage to the first diode; and
   a first transistor having first, second and third terminals, the first and second terminals being coupled between the high voltage rail and the output terminal of the second current mirror, the third terminal being a gate terminal that is coupled to the first diode and the first output terminal of the first current mirror, wherein an output voltage is available from the driver circuit that is less than the voltage on the high voltage rail.

2. The low power driver circuit of claim 1 wherein the first current mirror is a PMOS current mirror and the second current mirror is an NMOS current mirror.

3. The low power driver circuit of claim 1 wherein the output voltage is available at the second terminal of the first transistor.

4. The low power driver circuit of claim 1 wherein the output voltage is approximately 0.33 Volts.

5. The low power driver circuit of claim 1 further comprising a second diode coupled in series with the first diode between the first output terminal of the first current mirror and the low voltage rail.

6. The low power driver circuit of claim 5 wherein the second current mirror has a plurality of second output terminals and the apparatus further comprises a second transistor having first, second and third terminals, the first and second terminals being coupled between the high voltage rail and a second one of the second output terminals of the second current mirror, the third terminal being a gate terminal that is coupled to the first output terminal of the first current mirror and the gate terminal of the first transistor being coupled to the second terminal of the second transistor.

7. The low power driver circuit of claim 6 wherein the output voltage is approximately 0.66 Volts.

8. The low power driver circuit of claim 6 further comprising a third transistor having first second and third terminals, the first terminal being coupled to the second terminal of the second transistor, the second terminal being coupled to a one of the output terminals of the second current mirror, and third terminal being a gate terminal that is coupled to a node between two of the diodes.

9. The low power driver circuit of claim 8 wherein a second output voltage is available at the second terminal of the third transistor.

10. The low power driver circuit of claim 9 wherein the second output voltage is approximately 0.33 Volts.

11. A low power driver circuit comprising:
a first current mirror coupled to a high voltage rail, the first current mirror having a first output terminal;
a second current mirror coupled to a low voltage rail, the second current mirror having a second output terminal and a third output terminal;
at least first and second diodes coupled between the first output terminal of the first current mirror and the low voltage rail, wherein the first current mirror supplies a regulated voltage to the diodes;
a first transistor having first, second and third terminals, the first and second terminals being coupled between the high voltage rail and the second output terminal of the second current mirror, the third terminal being a gate terminal;
a second transistor having first, second and third terminals, the first and second terminals being coupled between the high voltage rail and the third output terminal of the second current mirror, the second terminal of the second transistor also being coupled to the third terminal of the first transistor, the third terminal of the second transistor being coupled to the first output terminal of the first current mirror and to the first diode; and
a third transistor having first, second and third terminals, the first and second terminals being coupled between the second terminal of the second transistor and the third output terminal of the second current mirror, the third terminal being a gate terminal that is coupled to a node between the first and second diodes;
wherein a first output voltage is available at the second terminal of the first transistor and a second output voltage is available at a second terminal of the third transistor.

12. The low power driver circuit of claim 11 wherein the first current mirror is a PMOS current mirror and the second current mirror is an NMOS current mirror.

13. The low power driver circuit of claim 11 wherein the first output voltage and the second output voltage are less than the voltage of the high voltage rail.

14. The low power driver circuit of claim 11 wherein the first output voltage is approximately 0.66 Volts.

15. The low power driver circuit of claim 11 wherein the second output voltage is approximately 0.33 Volts.

16. The low power driver circuit of claim 11 wherein the high voltage rail has a voltage of approximately 1.0 Volts, the low voltage rail has a voltage of approximately 0.0 volts, and the first and second output voltages are approximately 0.66 Volts and 0.33 Volts.

17. A method for reducing global interconnect delay on a field programmable gate array (FPGA) on an integrated circuit die comprising:
coding with a digital to analog coder on the integrated circuit die successive groups of n digital bits into a 2n level voltage or current signal where n is an integer greater than or equal to 2, wherein the digital to analog coder comprises a driver circuit, and wherein the driver circuit comprises a first current mirror coupled to a high voltage rail, a second current mirror coupled to a low voltage rail, a diode coupled to an output of the first current mirror, and a transistor coupled to the high voltage rail, an output of the second current mirror, and the output of the first current mirror;
transmitting the voltage or current signal on a global interconnect on the integrated circuit die;
receiving on the integrated circuit die the signal transmitted on the global interconnect; and
decoding the received signal on the integrated circuit die to reconstitute the successive groups of digital bits.

18. The method of claim 17 where n equals 2.

19. The method of claim 17 where n equals 3.

20. The method of claim 17 wherein a voltage signal is coded having voltage levels that are approximately 0.0, 0.33, 0.66 and 1.0 Volts.

* * * * *